United States Patent [19]

Muraoka et al.

[11] Patent Number: 4,920,282
[45] Date of Patent: Apr. 24, 1990

[54] DYNAMIC LATCH CIRCUIT FOR PREVENTING SHORT-CIRCUIT CURRENT FROM FLOWING DURING ABSENCE OF CLOCK PULSES WHEN UNDER TEST

[75] Inventors: Hiroaki Muraoka, Kawasaki; Toshiyuki Miyashita, Yokohama, both of Japan

[73] Assignee: Kabushiki Kaisha Toshiba, Kawasaki, Japan

[21] Appl. No.: 208,441

[22] Filed: Jun. 20, 1988

[30] Foreign Application Priority Data

Jun. 23, 1987 [JP] Japan .................................. 62-154532

[51] Int. Cl.[5] ..................... H03K 5/19; H03K 19/007; H03K 19/096
[52] U.S. Cl. .................................... 307/442; 307/452; 307/481; 307/279; 307/517; 377/28; 377/79
[58] Field of Search ............... 307/234, 517, 481, 453, 307/452, 442, 279; 377/28, 78, 79

[56] References Cited

U.S. PATENT DOCUMENTS

| | | | |
|---|---|---|---|
| 3,749,936 | 7/1973 | Bell | 307/442 |
| 3,906,258 | 9/1975 | Moe | 307/234 |
| 4,467,285 | 8/1984 | Rinaldi | 307/234 |
| 4,598,214 | 7/1986 | Sexton | 377/79 |
| 4,633,097 | 12/1986 | DeWitt | 307/517 |
| 4,686,386 | 8/1987 | Tatao | 307/453 |

*Primary Examiner*—John S. Heyman
*Attorney, Agent, or Firm*—Finnegan, Henderson, Farabow, Garrett and Dunner

[57] ABSTRACT

Described herein is a dynamic latch circuit having a pair of control terminals connected to receive complementary first and second control clock pulses which are generated at a predetermined frequency, and a register section for detecting the voltage of an input signal, in response to each of the first and second control clock pulses, and generating an output signal from a capacitive output node which is charged or discharged in accordance with the voltage of the input signal and is subsequently set at a low potential or a high potential. The latch circuit further comprises a voltage-generating circuit for detecting, based on a period of time elapsed from the trailing edge of the last generated first control clock pulse, that the supply of the first control clock pulses has been stopped and fixedly setting the output node at the low potential.

17 Claims, 2 Drawing Sheets

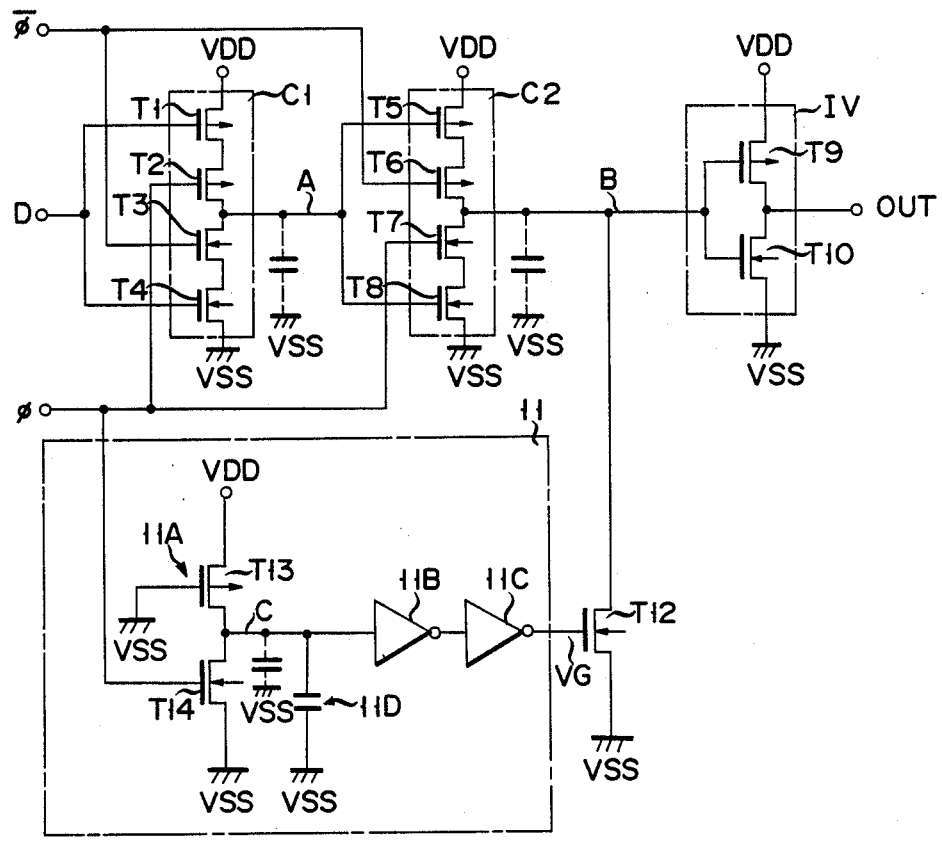
F I G. 2

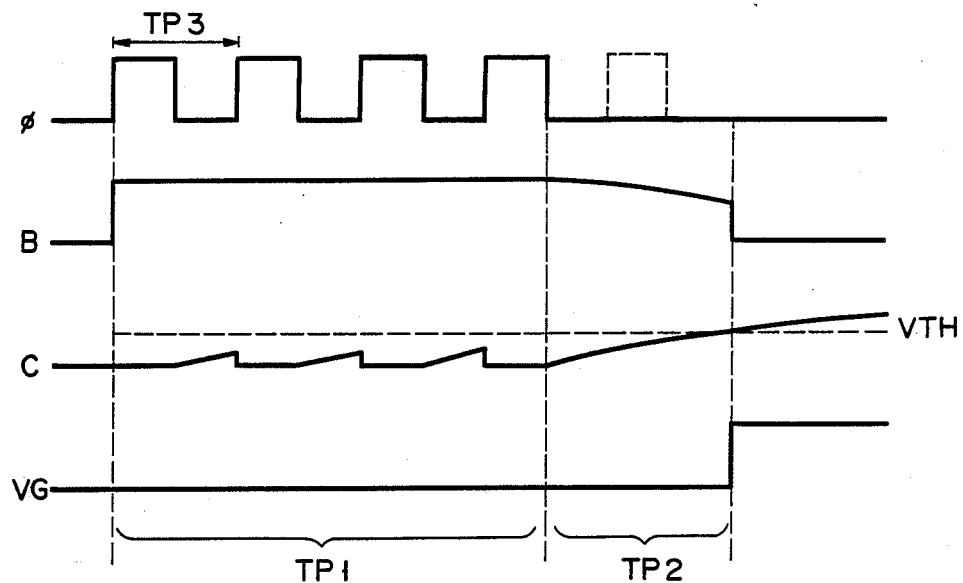
F I G. 3
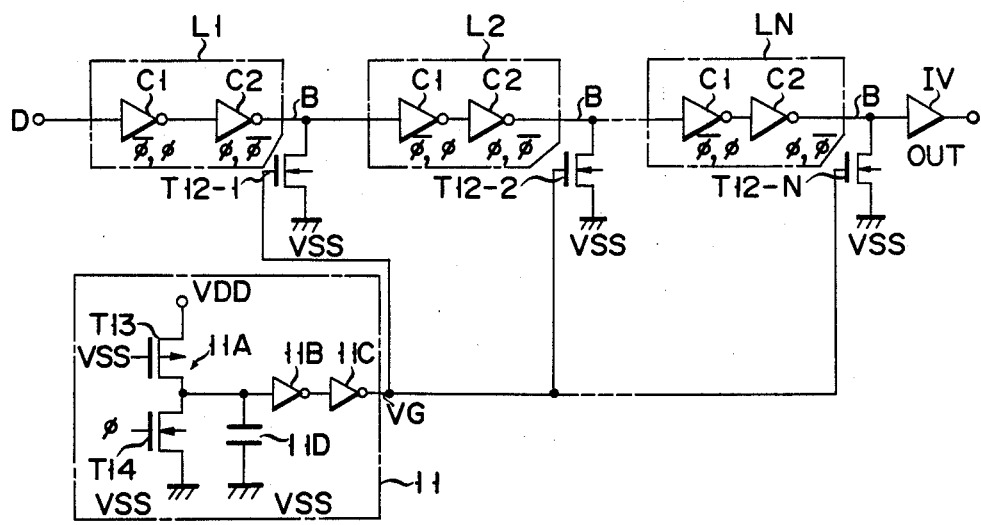
F I G. 4

DYNAMIC LATCH CIRCUIT FOR PREVENTING SHORT-CIRCUIT CURRENT FROM FLOWING DURING ABSENCE OF CLOCK PULSES WHEN UNDER TEST

BACKGROUND OF THE INVENTION

1. Field of the Invention

The present invention relates to a latch circuit for cyclically latching input signals and, more particularly, to a dynamic latch circuit to be formed within an LSI circuit chip.

2. Description of the Related Art

An LSI circuit chip is known which contains the dynamic latch circuit shown in FIG. 1. This latch circuit comprises an input terminal D, an output terminal OUT, CMOS clocked inverters C1 and C2, and a CMOS inverter IV. Clocked inverters C1, C2, and CMOS inverter IV are connected in cascade between input terminal D and output terminal OUT, with inverters C1 and C2 forming a master/slave register, and CMOS inverter IV functioning as an output buffer. The output operation of either CMOS clocked inverter is controlled by a pair of control clock signals $\phi$ and $\bar{\phi}$ which are complementary in potential and generated at a predetermined frequency.

Clocked inverter C2 charges or discharges the parasitic capacitance of node B of clocked inverter C2 and CMOS inverter IV during the first period, from the leading edge to the trailing edge of control clock pulses $\phi$ and $\bar{\phi}$, outputting a high impedance, from the trailing edge to the leading edge thereof, during the second period. Conversely, clocked inverter C1 outputs a high impedance during the first period of control clock pulses $\phi$ and $\bar{\phi}$, and, during the second period thereof, generates an output voltage, to charge or discharge the parasitic capacitance of node A of inverters C1 and C2. The potential of node A is used as the input signal to clocked inverter C2, and remains substantially equal to the output voltage of inverter C1 during the first period, due to the parasitic capacitance of node A. The potential of node B, on the other hand, is used as the input signal to CMOS inverter IV, remaining substantially equal to the output voltage of inverter IV during the second period, due to the parasitic capacitance of node B. Hence, the latch circuit latches the voltage signal supplied to input terminal D in one cycle, and, in the next cycle, outputs a logic signal "H" or "L", corresponding to the latched signal, from output terminal OUT.

When the LSI circuit is subjected to a DC test, a latch-up test, or other similar tests, wherein the latch circuit is not required to latch input signals cyclically, control clock pulses $\phi$ and $\bar{\phi}$ are not supplied inverters C1 and C2 for an extended period of time. After the supply of clock pulses $\phi$ and $\bar{\phi}$ has been stopped, and their levels set respectively at "L" and "H", the potential of node B gradually changes toward a value midway between the potential of the power-supply terminal VSS and that of the power-supply terminal VDD, this being due to a leakage current or the like. When the potential of node B changes to the extent that it can no longer produce a logic signal representing the output voltage of clocked inverter C2, both the P-channel and N-channel transistors forming inverter IV are turned on, whereby a short-circuit current starts flowing continuously between the power-supply terminals VDD and VSS. Since, in order for inverter IV to function as the output buffer, its MOS transistors have dimensions greater than those of the MOS transistors which form the master/slave register, the short-circuit current will therefore be relatively large, with the result that the difference between the potential of power-supply terminal VDD and that of power-supply terminal VSS will very likely be reduced. Such a reduction in the potential difference will cause the LSI circuit to operate erroneously, and hence decrease the reliability of the test. Further, if the LSI circuit happens to contain a large number of dynamic latch circuits, the sum of the short-circuit currents flowing in these circuits may exceed the rated current which can flow in the LSI circuit, in which case, the LSI circuit will break down.

SUMMARY OF THE INVENTION

It is accordingly the object of the present invention to provide a dynamic latch circuit wherein no short-circuit current will flow between the power-supply terminals, when control clock pulses have not been input for an extended period of time.

The object of the invention is attained by a dynamic latch circuit which comprises a control terminal section for receiving a control clock signal formed of clock pulses which are generated at a predetermined frequency, a register section for detecting the voltage of an input signal, in response to each clock pulse, and generating an output signal from a capacitive output node which is charged or discharged in accordance with the voltage of the input signal and is set at a first potential or a second potential, and voltage-generating means for detecting, based on a present pulse interval of the control clock signal equivalent to the period of time elapsed from the trailing edge of the last generated clock pulse, that the supply of the clock pulses has been stopped, and fixing the output node at the first potential or the second potential upon detecting that the supply of the clock pulses has been stopped.

The voltage-generating means compensates for the leakage current which flows in the dynamic latch circuit after the supply of the clock pulses has been stopped, thereby maintaining the output node at the first potential or the second potential. Therefore, even if the load of the capacitive output node is a CMOS transistor, this CMOS transistor is not turned on while no clock pulses are being input to the dynamic latch circuit. Thus, no short-circuit current can flow between the power-supply terminals via the CMOS transistor.

BRIEF DESCRIPTION OF THE DRAWINGS

FIG. 2 is a diagram illustrating the dynamic latch circuit according to a first embodiment of the present invention;

FIG. 3 is a timing chart explaining the operation of the latch circuit shown in FIG. 2; and FIG. 4 is a diagram showing the dynamic latch circuit according to a second embodiment of the invention, which functions as a shift register.

DETAILED DESCRIPTION OF THE PREFERRED EMBODIMENTS

Figure 1:
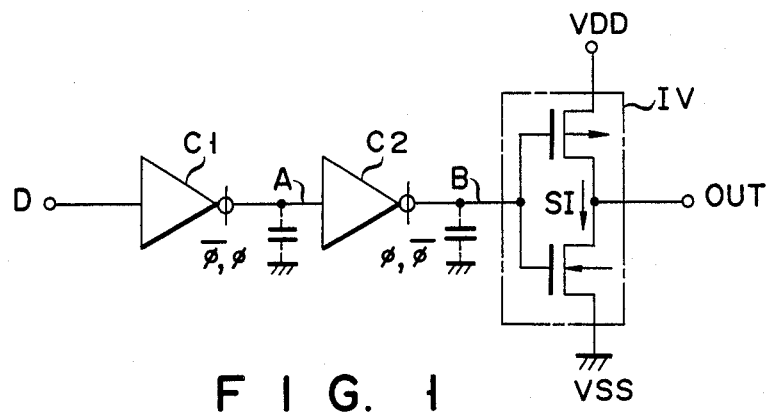
FIG. 1 is a diagram showing a conventional dynamic latch circuit.

The dynamic latch circuit according to a first embodiment of the present invention will now be described, with reference to FIGS. 2 and 3.

FIG. 2 is a diagram showing this dynamic latch circuit. As is shown in this figure, the dynamic latch circuit comprises CMOS clocked inverters C1 and C2 which form a master/slave register, and CMOS inverter IV which functions as an output buffer, just like the conventional dynamic latch circuit shown in FIG. 1.

Clocked inverter C1 is made up of P-channel MOS transistors T1 and T2 and N-channel MOS transistors T3 and T4. The gates of MOS transistors T1 and T4 are connected to input terminal D, to which a logic signal is input. The gates of transistors T3 and T2 are connected to receive, respectively, control clock pulses $\phi$ and $\bar{\phi}$, these clock pulses being generated each at a predetermined frequency and being complementary to each other in potential. The current paths of transistors T1 and T2 are connected in series between output node A and power-supply terminal VDD. The current paths of transistors T3 and T4 are connected between node A and power-supply terminal VSS. Power-supply terminal VSS is set at a potential (0 V), which is the reference potential for logic value "L", and power-supply terminal VDD is set at a potential (5 V or 3 V) which is higher than that of terminal VSS and is the reference potential for logic value "H".

Clocked inverter C2 is made up of P-channel MOS transistors T5 and T6 and N-channel MOS transistors T7 and T8. The gates of transistors T5 and T8 are coupled to output node A, whereas the gates of transistors T6 and T7 are connected to receive control clock pulses $\phi$ and $\bar{\phi}$, respectively. The current paths of transistors T5 and T6 are coupled in series between output node B and power-supply terminal VDD, and the current paths of transistors T7 and T8 are connected in series between output node B and power-supply terminal VSS.

CMOS inverter IV consists of P-channel MOS transistors T9 and N-channel MOS transistor T10. The gates of transistors T9 and T10 are coupled to output node B, with the current path of transistor T9 being connected between power-supply terminal VDD and output terminal OUT, and the current path of transistor T10 being connected between output terminal OUT and power-supply terminal VSS. The intervals of control clock pulses $\phi$ and $\bar{\phi}$ are shorter than a period within which the potentials of nodes A and B can be maintained by their parasitic capacitance, and represent the logic value "H" or "L" corresponding to the output voltage of clocked inverter C1 or C2. The output voltages of inverters C1 and C2 are maintained by the parasitic capacitances of nodes A and B, respectively, after both nodes have become electrically floating.

The dynamic latch circuit further comprises N-channel MOS transistor T12 and control circuit 11 for controlling the former. MOS transistor T12 functions as a switching element, and its current path is connected between output node B and power-supply terminal VSS. Control circuit 11 has CMOS inverters 11A, 11B, and 11C and capacitor 11D. CMOS inverter 11A is made up of P-channel MOS transistor T13 and N-channel MOS transistor T14. MOS transistor T13 has a gate coupled to power-supply terminal VSS and a current path connected between power-supply terminal VDD and output node C, and functions as a register. The gate of MOS transistor T14 is connected to receive control clock pulse $\phi$, and its current path is connected between output node C and power-supply terminal VSS. Capacitor 11D is coupled between output node C and power-supply terminal VSS. CMOS inverters 11B and 11C are connected in cascade between output node C and the gate of MOS transistor T12, and are used to turn on transistor T12 when the potential of output node C exceeds the threshold voltage VTH of CMOS inverter 11B. MOS transistor T14 is turned on at the leading edge of control clock pulse $\phi$, and is turned off at the trailing edge thereof. When transistor T14 is turned on, the potential of output node C changes quickly to the potential of power-supply terminal VSS, which is lower than the threshold voltage VTH of CMOS inverter 11B. Conversely, when transistor T14 is turned off, the potential of output node C rises, with a time delay, above the threshold voltage VTH of CMOS inverter 11B. This time delay is determined by the product of the resistance of MOS transistor T13, on the one hand, and the sum of the capacitance of capacitor 11D and the parasitic capacitance of output node C, on the other. The time delay is longer than the interval of control clock pulses $\phi$ and $\bar{\phi}$, and is shorter than the period within which the potential of node B can output a logic value representing the output voltage of clocked inverter C2.

The operation of the dynamic latch circuit described above will now be explained, with reference to the timing chart shown in FIG. 3. Clocked inverters C1 and C2 output signals in the same way as their counterparts used in the conventional latch circuit illustrated in FIG. 1. In FIG. 3, TP1 designates the period during which control clock pulses $\phi$ and $\bar{\phi}$ continue to be supplied to the dynamic latch circuit; TP2 represents the time required to detect that the supply of these pulses has been stopped; and TP3 indicates the time equal to one cycle of control clock pulses $\phi$ and $\bar{\phi}$.

Control clock pulses $\phi$ and $\bar{\phi}$ are supplied to the dynamic latch circuit, simultaneously and at a predetermined frequency. MOS transistor T14 is turned off when clock pulses $\phi$ falls. Thus, the potential of output node C rises. Clock pulse $\phi$ rises before the potential of output node C to the threshold voltage VTH of inverter 11B. Hence, transistor T14 is turned on before the potential of output node C reaches the threshold voltage VTH. As a result, the potential of output node C remains lower than the threshold voltage VTH of inverter 11B during period TP1 when control clock pulses $\phi$ and $\bar{\phi}$ continue to be supplied to the latch circuit. During this period TP1, inverters 11B and 11C continue to generate an output voltage at the "H" level and an output voltage at the "L" level, respectively. The output voltage of inverter 11C, which is at the "L" level, is applied as control voltage VG to MOS transistor T12, thereby turning this transistor off. In the interval of control clock pulses $\phi$ and $\bar{\phi}$, the potential of output node B changes due to a leakage current or the like, but stays at a level corresponding to the logic value "H" or "L" determined by the output voltage of clocked inverter C2.

When the supply of control clock pulses $\phi$ and $\bar{\phi}$ is stopped, the potential of output node C continues rising even after the rising edge of a pulse $\phi$ which should be next generated. The moment this potential rises above the threshold voltage VTH of inverter 11B, it is detected that the supply of control clock pulses $\phi$ and $\bar{\phi}$ has been stopped. At this moment, inverters 11B and 11C generate voltages at the "L" level and the "H" level, respectively. The output voltage of inverter 11C, which is at the "H" level, is applied as control voltage VG to MOS transistor T12, thereby turning transistor T12 on. As a result, the potential of output node B is fixed at a value equal to the potential of power-supply terminal VSS, and does not fall below the threshold voltage VTH of inverter 11B until control clock pulses φ and φ̄ are again supplied to the latch circuit. Therefore, neither transistor T9 or T10 of inverter IV is turned on while neither clock pulses φ nor clock pulse φ̄ is supplied to the dynamic latch circuit. Hence, no short-circuit current flows between power-supply terminals VDD and VSS via CMOS inverter IV, thereby preventing the LSI chip, in which the latch circuit is incorporated, from breaking down when the circuit is subjected to any of a variety of tests.

FIG. 4 illustrates another dynamic latch circuit according to the present invention, which is similar to the dynamic latch circuit shown in FIG. 2. Where this circuit differs from that of FIG. 2 is in it having n master/slave registers L1 to LN and N N-channel MOS transistors T12-1 to T12-N. Registers L1 to LN have a structure identical to that of the master/slave register incorporated in the circuit shown in FIG. 2, and are connected such that they constitute a shift register. Each of transistors T12-1 to T12-N has its gate coupled to the output terminal of control circuit 11, and its current path connected between power-supply terminal VSS and the output node B of the master/slave register corresponding to the MOS transistor. Transistors T12-1 to T12-N are turned on or off in accordance with the control voltage generated by control circuit 11.

Through the circuit shown in FIG. 4 is simple in structure, a short-circuit current can nevertheless be prevented from flowing through a MOS transistor circuit between power terminals.

According to the present invention, control circuit 11 used in either embodiment described above can be replaced by any other circuit which is able to detect that the supply of control clock pulses φ and φ̄ is stopped, and turn off the MOS transistors upon detecting this fact.

In the embodiments described above, the potential of output node B is fixed at a value equal to the potential of power-supply terminal VSS when control circuit 11 detects that the supply of control clock pulses φ and φ̄ is stopped. Alternatively, the potential of output node B can be fixed at a value equal to that of power-supply terminal VDD, in which case, the P-channel MOS transistors, whose current paths are connected between power-supply terminal VDD and output node B, are used as switching elements and are turned on by control circuit 11 when it detects that the supply of clock pulses φ and φ̄ is stopped.

What is claimed is:

1. A dynamic latch circuit comprising:
   a control terminal section for receiving a control clock signal formed of clock pulses which are generated at a predetermined frequency;
   a plurality of register sections each for detecting a voltage of an input signal, in response to each clock pulse, generated an output signal from a capacitive output node which is charged or discharged in accordance with the voltage of the input signal and is selectively set at one of first and second potentials; and
   voltage-generating means for detecting, based on a pulse interval of the control clock signal equivalent to the period of time elapsed from the trailing edge of the last generated clock pulse, that the supply of the clock pulses has been stopped, and for fixing the output nodes of said register sections at a predetermined one of said first and second potentials, upon detecting that the supply of the clock pulses has been stopped,
   said voltage-generating means having timer means for detecting that said pulse interval of the control clock signal exceeds a reference period equal to an interval determined by said predetermined frequency, a power-supply terminal set at the first potential, and a plurality of switching elements connected between the power-supply terminal and the respective capacitive output nodes of said register sections, said switching elements being turned on under the control of a signal output by said timer means which it is detected that the supply of the clock pulses has been stopped.

2. The dynamic latch circuit according to claim 1, wherein said register sections are connected in cascade, thereby constituting a shift register.

3. A dynamic latch circuit for preventing short-circuit current from flowing during absences of clock pulses when under test comprising:
   a first power-supply terminal set at a potential of a first level;
   a second power-supply terminal set at a potential of a second level;
   a control terminal section for receiving a control clock signal which is generated at a predetermined frequency, said control clock signal having potentials of third and fourth levels which are alternatively generated, and which are maintained at the potential of the third level when a test is performed;
   a register section connected between said first and second power-supply terminals to receive an input signal and the control clock signal from said control terminal section, for detecting a voltage of the input signal, in response to the control clock, and generated an output signal from a capacitive output node which is charged or discharged in accordance with the detected voltage and is selectively set at one of the potentials of the first and second levels;
   detection means connected to said control terminal section, for detecting that the control clock signal has been maintained at the potential of the third level and outputting a detection signal upon the detection; and
   switching means connected between said first power-supply terminal and said capacitive output node for receiving the detection signal from said detection means, and fixing a potential of said capacitive output node at the first level.

4. The dynamic latch circuit according to claim 3, further comprising an operation circuit which is connected between said first and second power-supply terminals to receive the output signal generated at said capacitive output node, and which operates in accordance with the output signal, wherein short-circuit current is prevented from flowing between said first and second power-supply terminals through said operation circuit by fixing the potential at said capacitive output node at the first level when said switching means is turned on.

5. The dynamic latch circuit according to claim 4, wherein said operation circuit comprises a CMOS inverter connected to said capacitive output node for functioning as an output buffer for said register section.

6. The dynamic latch circuit according to claim 5, wherein said detection means includes timer means for detecting when said pulse interval of said control clock signal exceeds a predetermined reference period equal to an interval determined by said frequency.

7. The dynamic latch circuit according to claim 6, wherein said time means includes capacitive means, charging means for charging the capacitive means, discharging means for discharging the capacitive means, in response to each clock pulse, and voltage-detecting means for detecting that the voltage of said capacitive means has reached a predetermined value after said reference period has elapsed.

8. The dynamic latch circuit according to claim 7, wherein said charging means includes resistor means for limiting current accumulated in said capacitive means.

9. The dynamic latch circuit according to claim 7, wherein said voltage-detecting means includes a CMOS inverter having a threshold voltage of said predetermined value.

10. The dynamic latch circuit according to claim 3, wherein said register section includes a CMOS clocked inverter which is enabled to output a high impedance during said pulse interval of said control clock signal.

11. A dynamic latch circuit for preventing short-circuit current from flowing during absences of clock pulses when under test comprising:
a first power-supply terminal set at a potential of a first level;
a second power-supply terminal set at a potential of a second level;
a control terminal section for receiving a control clock signal which is generated at a predetermined frequency, said control clock signal having potentials of third and fourth levels which are alternatively generated, and which are maintained at the potential of the third level when a test is performed;
a plurality of register sections each connected between said first and second power-supply terminals to receive an input signal and the control clock signal from said control terminal section, each of said plurality of register sections detects a voltage of the input signal, in response to the control clock, and generates an output signal from a capacitive output node which is charged or discharged in accordance with the detected voltage and is selectively set at one of the potentials of the first and second levels;
detection means connected to said control terminal section, for detecting that the control clock signal has been maintained at the potential of the third level and outputting a detection signal upon the detection; and
a plurality of switching means each of which is connected between said first power-supply terminal and each of said capacitive output nodes for receiving the detection signal from said detection means, each said switching means turning on upon receipt of the detection signal from said detection means and fixing a potential of said capacitive output node at the first level.

12. The dynamic latch circuit according to claim 11, further comprising an operation circuit which is connected between said first and second power-supply terminals to receive the output signal generated at least one of said capacitive output nodes and which operates in accordance with the output signal, wherein a short-circuit current is prevented from flowing between said first and second power-supply terminals through said operation circuit by fixing the potential at said capacitive output node at the first level when said switching means is turned on.

13. The dynamic latch circuit according to claim 12, wherein said register sections are connected in cascade to constitute a shift register, and said operation circuit comprises a CMOS inverter for functioning as an output buffer for said register sections connected to cascade.

14. The dynamic latch circuit according to claim 13, wherein said detection means includes timer means for detecting when said present pulse interval of said control clock signal exceeds a predetermined reference period equal to an interval determined by said frequency.

15. The dynamic latch circuit according to claim 14, wherein said timer means includes capacitive means, charging means for charging the capacitive means, discharging means for discharging the capacitive means, in response to each clock pulse, and voltage-detecting means for detecting that the voltage of said capacitive means has reached a predetermined value after said reference period has elapsed.

16. The dynamic latch circuit according to claim 15, wherein said charging means includes resistor means for limiting current accumulated in said capacitive means.

17. The dynamic latch circuit according to claim 16, wherein said voltage-detecting means includes a CMOS inverter having a threshold voltage of said predetermined value.

* * * * *